United States Patent
Rahimo et al.

(10) Patent No.: US 9,385,223 B2
(45) Date of Patent: Jul. 5, 2016

(54) REVERSE-CONDUCTING POWER SEMICONDUCTOR DEVICE

(71) Applicant: ABB Technology AG, Zurich (CH)

(72) Inventors: Munaf Rahimo, Uezwil (CH); Martin Arnold, Baden (CH); Jan Vobecky, Lenzburg (CH); Umamaheswara Vemulapati, Wettingen (CH)

(73) Assignee: ABB TECHNOLOGY AG, Zürich (CH)

( * ) Notice: Subject to any disclaimer, the term of this patent is extended or adjusted under 35 U.S.C. 154(b) by 0 days.

(21) Appl. No.: 14/748,774

(22) Filed: Jun. 24, 2015

(65) Prior Publication Data

US 2016/0013302 A1    Jan. 14, 2016

(30) Foreign Application Priority Data

Jun. 26, 2014  (EP) .................................... 14174099

(51) Int. Cl.
| | | |
|---|---|---|
| *H01L 29/74* | (2006.01) | |
| *H01L 27/06* | (2006.01) | |
| *H01L 29/744* | (2006.01) | |

(52) U.S. Cl.
CPC ........ *H01L 29/7416* (2013.01); *H01L 27/0664* (2013.01); *H01L 29/744* (2013.01)

(58) Field of Classification Search
CPC .............. H01L 29/7416; H01L 29/744; H01L 27/0664
See application file for complete search history.

(56) References Cited

U.S. PATENT DOCUMENTS

| 4,742,382 A | 5/1988 | Jaecklin |
|---|---|---|
| 2013/0207157 A1 | 8/2013 | Rahimo et al. |

FOREIGN PATENT DOCUMENTS

| EP | 0 200 863 A1 | 12/1986 |
|---|---|---|
| WO | WO 2012/041958 A2 | 4/2012 |

OTHER PUBLICATIONS

European Search Report for EP 14174099 dated Dec. 1, 2014.
Y. Yamaguchi et al., "A 6kV/5kA Reverse Conducting GCT", Conference Record of the 2001 IEEE Industry Applications Conference, Sep. 30, 2001, pp. 1497-1503, vol. 3.

*Primary Examiner* — Whitney T Moore
(74) *Attorney, Agent, or Firm* — Buchanan Ingersoll & Rooney PC

(57) ABSTRACT

A reverse-conducting power semiconductor device with a wafer has first and second main sides which are arranged opposite and parallel to each other. The device includes a plurality of diode cells and a plurality of gate commutated thyristors (GCT) cells. Each GCT cell includes layers of a first conductivity type (e.g., n-type) and a second conductivity type (e.g., p-type) between the first and second main sides. The device includes at least one mixed part in which diode anode layers of the diode cells alternate with first cathode layers of the GCT cells. In each diode cell, a diode buffer layer of the first conductivity type is arranged between the diode anode layer and a drift layer such that the diode buffer layer covers lateral sides of the diode anode layer from the first main side to a depth of approximately 90% of the thickness of the diode anode layer.

31 Claims, 5 Drawing Sheets

REVERSE-CONDUCTING POWER SEMICONDUCTOR DEVICE

RELATED APPLICATION

This application claims priority to European Application 14174099.3 filed on Jun. 26, 2014. The entire content of this application is hereby incorporated by reference in its entirety.

FIELD

The present disclosure relates to the field of power semiconductor devices. More particularly, the present disclosure relates to a reverse conducting power semiconductor device.

BACKGROUND INFORMATION

A reverse conducting gate commutated thyristor (RC-GCT) combines one or more gate commutated thyristors (GCTs) and one or more diodes within a single power semiconductor device. A bi-mode gate commutated thyristor (BGCT) is a RC-GCT which includes, in a single semiconductor wafer, a plurality of GCT regions or cells electrically connected in parallel to one another, and a plurality of diode cells distributed between the GCT cells. The diode cells are also electrically connected in parallel to one another and to the GCT cells, albeit with opposing forward direction.

The diode cells provided in the semiconductor wafer allow for operating the BGCT in a diode mode, thus providing for reverse conductivity of the BGCT, which is required for a plurality of applications in power electronics.

A known BGCT is described in WO 2012/041958 A2, which is hereby included by reference in its entirety. FIG. 1 shows a cross-sectional view of the BGCT known from WO 2012/041958 A2.

The known BGCT 1' includes a semiconductor wafer having a first main side 11 and a second main side 15. The second main side 15 is arranged parallel to the first main side 11. The known BGCT 1' includes an (n−)-doped drift layer 3 located between—and extending in a direction parallel to—the first main side 11 and the second main side 15. The known BGCT 1' also includes a plurality of GCT cells 91, where each GCT cell 91 includes layers in the wafer in the following order between the first main side 11 and the second main side 15: an n-doped thyristor cathode layer 4, a p-doped thyristor base layer 6, a thyristor drift layer 3' (which is part of the drift layer 3), an n-doped thyristor buffer layer 8 and a (p+)-doped thyristor anode layer 5. The GCT cell 91 also includes a thyristor cathode electrode 2 arranged on the first main side 11 on each thyristor cathode layer 4, a thyristor anode electrode 25 arranged on the second main side 15 on each thyristor anode layer 5, and a plurality of gate electrodes 7 arranged on each thyristor base layer 6 lateral to, but separated from, the thyristor cathode electrode 2 and the thyristor cathode layer 4. The gate electrodes 7 contact the p-doped thyristor base layer 6.

In addition, the BGCT 1' includes a plurality of diode cells 96 which include layers in the following order in the semiconductor wafer between the first and second main sides 11, 15: a p-doped diode anode layer 55, a diode drift layer 3" (which is part of the drift layer 3), and an n-doped diode cathode layer 45, which is arranged alternating to the thyristor anode layer 5 adjacent to the second main side 15. Finally, the BGCT 1' includes a diode anode electrode 28 arranged on the first main side 11 on each diode anode layer 55. The plurality of diode cells 96 form the diode part of the reverse conducting semiconductor device of the BGCT 1'.

The diode cells 96 are separated from the GCT cells 91 by uniform separation regions 350, which are formed by parts of the drift layer 3 located between the diode cells 96 and GCT cells 91 and where the drift layer 3 extends to the first main side 11.

For a known BGCT, in the GCT mode operation, the dedicated diode regions are utilized during conduction due to the plasma (charge) spreading into those regions. In the diode mode operation, the dedicated GCT regions are also utilized. The tilted arrows in FIG. 1 show the expected plasma spread in GCT mode operation, which can be inverted for the diode mode.

The dimensioning of the GCT cells 91 and separation area between the diode and GCT cells 91, 96 is an important factor for area utilization. The separation regions 350 must be designed to enable the required blocking capability for the gate drive (gate cathode blocking capability, e.g., −20 V during GCT turn off and blocking) while keeping the dimensions (separation region distance) to a minimum for total area utilization (in order to enable plasma spreading from GCT regions 91 to dedicated diode regions 96 in the GCT mode of operation and vice versa).

In high voltage devices like BGCTs 1', the N−−base (N-drift layer) is usually very low doped and if the separation region distance is small, there is a possibility for the punch-through effect and eventually this region cannot block the required gate drive voltage. Even if the small separation distance is enough to block the required gate drive voltage (during turn-off and blocking), there will be a high gate cathode leakage current since PNP (p-thyristor base layer 6, n-drift layer 3, p-diode anode layer 55) gain is too high due to the low doped n-drift layer 3 and a small distance of the n-drift layer 3 between the thyristor base layer 6 and the diode anode layer 55, i.e., the width of the separation region 350.

SUMMARY

An exemplary embodiment of the present disclosure provides a reverse-conducting power semiconductor device with a wafer having a first main side and a second main side. The second main side is arranged parallel to the first main side. The exemplary device includes a plurality of diode cells, and a plurality of gate commutated thyristor (GCT) cells. Each GCT cell includes layers in the following order between the first and second main sides: (i) a thyristor cathode electrode; (ii) a thyristor cathode layer of a first conductivity type; (iii) a thyristor base layer of a second conductivity type different from the first conductivity type; (iv) a drift layer of the first conductivity type; (v) a thyristor buffer layer of the first conductivity type; (vi) a thyristor anode layer of the second conductivity type; and (vii) a thyristor anode electrode. Each GCT cell also includes a gate electrode which is arranged lateral to the thyristor cathode layer and separated from the thyristor cathode layer by the thyristor base layer. Each diode cell includes (i) a diode anode electrode on the first main side, (ii) a diode anode layer of the second conductivity type which is separated from the thyristor base layer by the drift layer, (iii) the drift layer, (iv) a diode cathode layer of the first conductivity type which is arranged alternating to the thyristor anode layer on the second main side, and (v) a diode cathode electrode, The device also includes at least one mixed part in which the diode anode layers of the diode cells alternate with the first cathode layers of the GCT cells. In at least one of the diode cells, a diode buffer layer of the first conductivity type is arranged between the diode anode layer and the drift layer such that the diode buffer layer covers lateral sides of the diode anode layer from the first main side at least to a depth of 90% of the thickness of the diode anode layer.

BRIEF DESCRIPTION OF THE DRAWINGS

Additional refinements, advantages and features of the present disclosure are described in more detail below with reference to exemplary embodiments illustrated in the drawings, in which.

Figure 1:
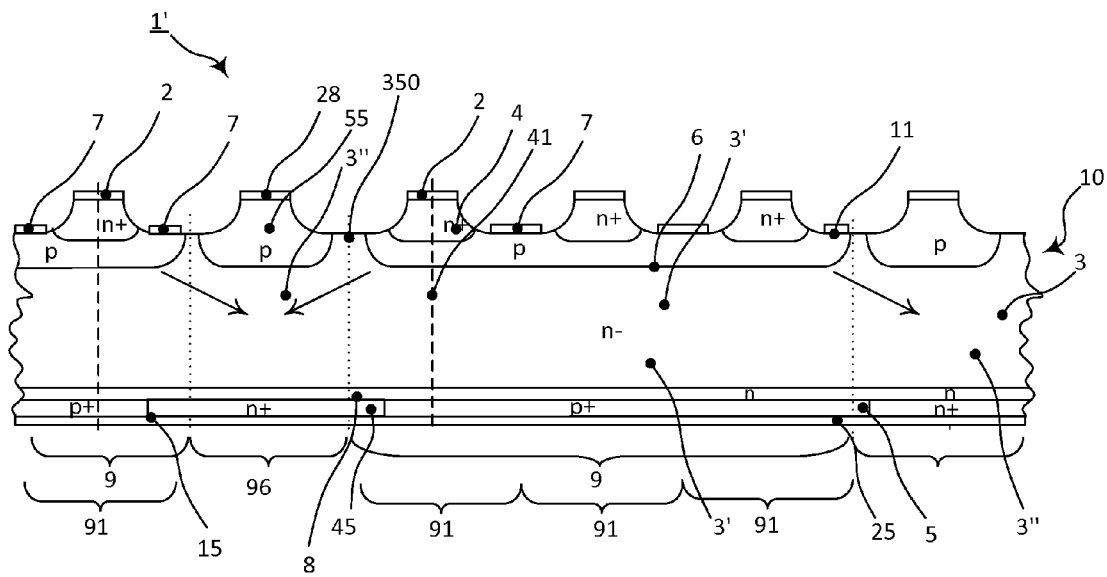
FIG. 1 shows a cross-sectional view of a known BGCT.

The reference symbols used in the drawings and their meaning are summarized in the list of reference symbols. Generally, identical or similarly functioning parts are given the same reference symbols. The embodiments described below are intended to be examples and shall not confine the present disclosure.

DETAILED DESCRIPTION

Figure 2:
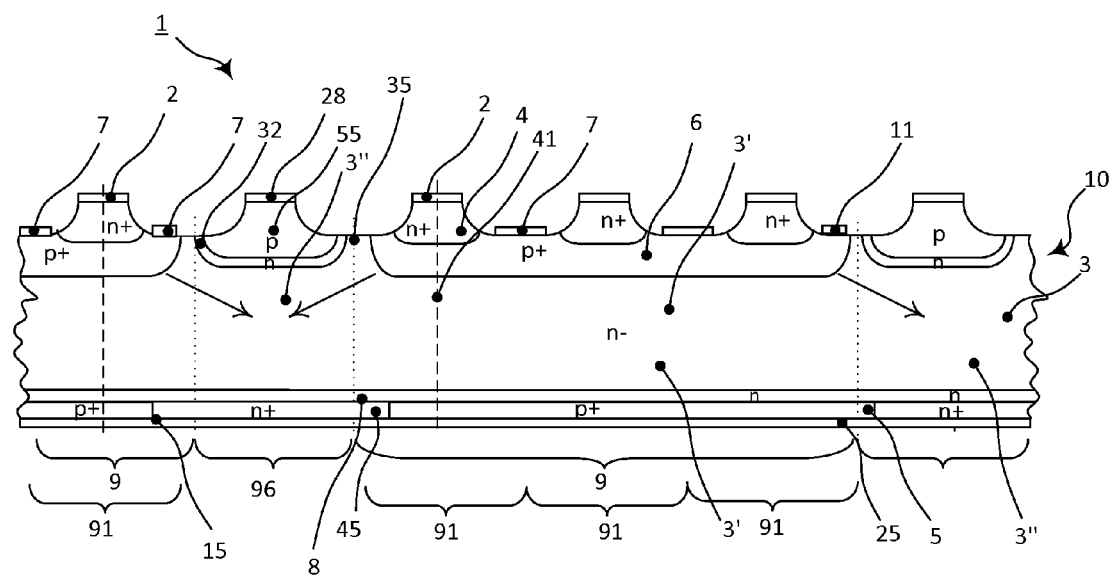
FIG. 2 shows a cross-sectional view of an RC-GCT according to an exemplary embodiment of the present disclosure.

Exemplary embodiments of the present disclosure provide a reverse conducting power semiconductor device with improved reduced lateral PNP (e.g., p-thyristor base layer 6, n-drift layer 3, p-diode anode layer 55 in FIG. 2) gain at the separation region.

According to an exemplary embodiment of the present disclosure, the reverse conducting power semiconductor device includes a wafer (also called a semiconductor chip) having a first main side and a second main side, which is arranged parallel to the first main side. The device includes a plurality of diode cells and a plurality of GCT cells ((integrated) gate commutated thyristor cells). According to an exemplary embodiment, each GCT cell includes layers in the following order between the first and second main sides: (i) a thyristor cathode electrode, (ii) a thyristor cathode layer of a first conductivity type (e.g., n-type), (iii) a thyristor base layer of a second conductivity type (e.g., p-type) different from the first conductivity type, (iv) a thyristor drift layer of the first conductivity type, (v) a thyristor buffer layer of the first conductivity type, (vi) a thyristor anode layer of the second conductivity type, and (vii) a thyristor anode electrode.

Each GCT cell also includes a gate electrode, which is arranged lateral to the thyristor cathode layer and separated from the thyristor cathode layer by the thyristor base layer. Such GCT cells are known in the art. They are similar to GTO cells in their construction, from which they are a further development, but differ from them in the gate control and switching on and off. As used herein, the positioning of a GCT cell refers to the positioning of the thyristor cathode layer (and gate electrode and thyristor base layer), for example, the positioning of the first main sided layers of the IGCT cell.

According to an exemplary embodiment, each diode cell includes (i) a diode anode electrode on the first main side, which is in contact with (ii) a second anode layer of the second conductivity type. The diode anode layer is separated from the thyristor base layer by the drift layer. Each diode cell also includes (iii) a diode drift layer, (iv) a diode cathode layer of the first conductivity type on the second main side, which is arranged alternating to the thyristor anode layer, and (iv) a diode cathode electrode, which is formed as a common electrode with the thyristor anode electrode. The thyristor drift layer and the diode drift layer form a drift layer, which is a continuous layer over a whole plane of the wafer in a plane parallel to the first main side.

As used herein, the positioning of a diode cell refers to the positioning of the diode anode layer, for example, the positioning of the first main sided layers of the diode cell. In each diode cell, a diode buffer layer of the first conductivity type is arranged between the diode anode layer and the drift layer such that the diode buffer layer covers lateral sides of the diode anode layer from the first main side at least to a depth of approximately 90% of the thickness of the diode anode layer.

According to an exemplary embodiment, the device includes at least one mixed part, in which diode cells (e.g., the diode anode layers of the diode cells) alternate with GCT cells (e.g., the thyristor cathode layers (and gate electrode and thyristor base layer) of the GCT cells).

Figure 7:
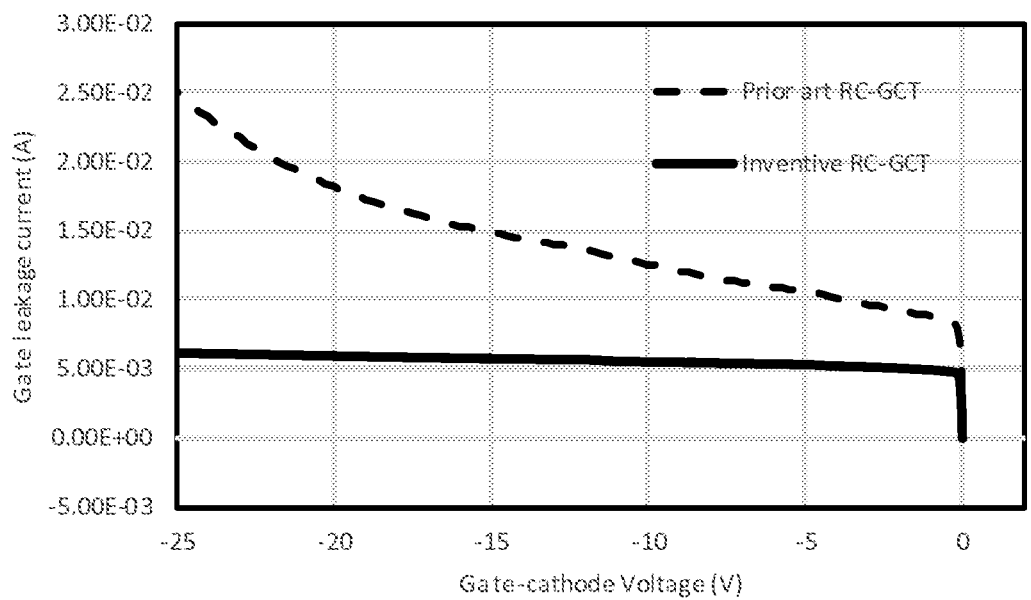
FIG. 7 shows gate blocking characteristics of an RC-GCT according to an exemplary embodiment of the present disclosure compared to a known BGCT.

Due to the introduction of the diode buffer layer, the lateral PNP gain of the parasitic BJT at the separation region and hence the gate-cathode leakage current is reduced considerably as shown in FIG. 7. For a voltage of −20 V, the leakage current can be reduced by factor of 3 from a known BGCT to the RC-GCT according to the present disclosure.

Figure 8:
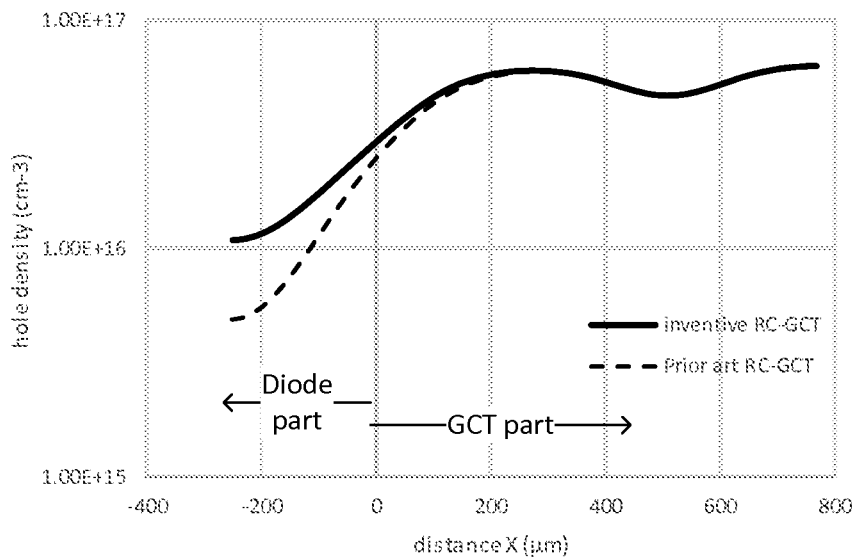
FIG. 8 shows on-state characteristics of an RC-GCT according to an exemplary embodiment of the present disclosure compared to a known BGCT in a plane parallel to the first main side on an axis going through a diode cell and a thyristor cell.
Figure 9:
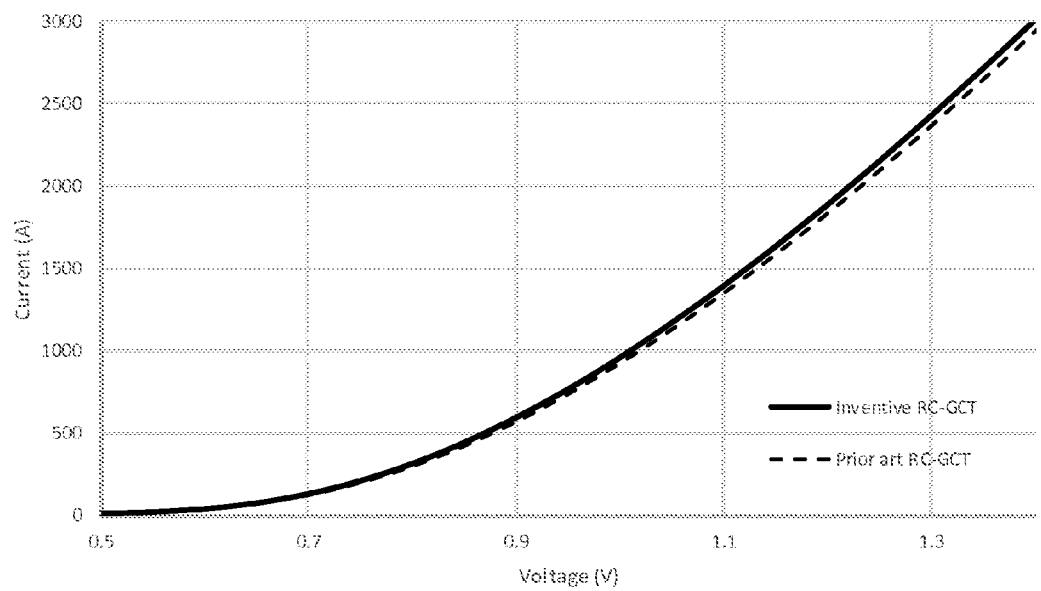
FIG. 9 shows on-state characteristics of an RC-GCT according to an exemplary embodiment of the present disclosure compared to a known BGCT for the anode current versus anode voltage.

For FIGS. 7 to 9, the graphs have been obtained from RC-GCTs having a diode anode layer 55 with a maximum doping concentration of $1*10^{17}$ cm$^{-3}$, and a thickness of the diode anode layer from the surface of the wafer to the pn junction of 20 μm.

Figure 10:
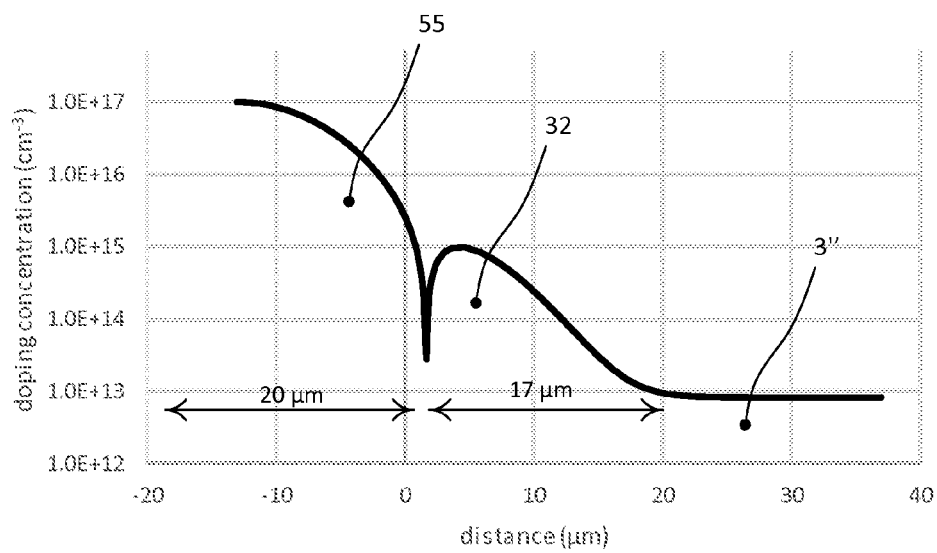
FIG. 10 shows the doping profile in a diode cell for the diode anode layer, diode buffer layer to the diode drift layer, according to an exemplary embodiment of the present disclosure.

The diode buffer layer in this example has a maximum doping concentration of $1*10^{15}$ cm$^{-3}$, and a thickness of the diode buffer layer from the diode anode junction to n− drift layer of 17 μm. The sheet carrier concentration of the diode buffer is $7*10^{11}$ cm$^{-2}$. FIG. 10 shows the doping profile in the diode cell for the diode anode layer 55, diode buffer layer 32 and the diode drift layer 3" for the illustrative embodiment of the RE-GCT used in this example.

In accordance with an exemplary embodiment of the present disclosure, the lateral PNP gain may be further reduced by a weakening of the diode anode efficiency. This may be achieved by proving a diode anode layer of lower thickness and/or lower depth than the thyristor base layer.

The n-diode buffer layer around the diode anode layer of the BGCT not only reduces the lateral PNP gain (between the diode p-anode layer, n-drift layer and GCT p-thyristor base layer), but also reduces the vertical PNP gain (p-GCT anode layer, n-drift layer, diode p-anode layer), thereby improving the on-state performance of the BGCT in GCT mode by enhancing the plasma in the diode part (left sided part of FIG. 8), because the diode n-buffer layer acts as an enhancement layer in the diode part of the device as shown in FIG. 8 without significant impact on the main blocking capability of the BGCT.

Due to the introduction of the diode n-buffer layer, the separation region width can be kept at a minimum. This allows a better utilization of wafer area (which may be of silicon, for example) due to plasma spread from GCT regions to dedicated diode regions in the GCT mode and vice versa.

FIG. 9 shows the on-state characteristics of the RC-GCT according to an exemplary embodiment of the present disclosure, in comparison to the on-state characteristics of a known RC-GCT. FIG. 9 shows the anode current against anode voltage. The RC-GCT of the present disclosure is superior in view of the on-state performance compared to that of the known RC-GCT due to the improved plasma distribution, which is shown in FIG. 8.

Additional advantages of the reverse conducting power semiconductor device of the present disclosure are described with reference to the exemplary embodiments illustrated in the drawings.

FIG. 2 shows an exemplary embodiment of a semiconductor device in the form of a reverse conducting power semiconductor device 1 with a wafer 10 having a first main side 11 and a second main side 15, which is arranged parallel to the first main side 11. The device includes a plurality of diode cells 96 and a plurality of GCT cells 91. According to the illustrated embodiment, each GCT cell 91 includes layers in the following order between the first and second main sides 11, 15: (i) a thyristor cathode electrode 2 (e.g., exemplarily in the form of an cathode metallization layer), (ii) an n+ doped thyristor cathode layer 4 (e.g., exemplarily in the form of a cathode metallization layer), (iii) a p doped thyristor base layer 6, (iv) an (n−) doped thyristor drift layer 3', (v) an n-doped thyristor buffer layer 8, (vi) a p+ doped thyristor anode layer 5, and (vii) a thyristor anode electrode 25 (e.g., exemplarily in the form of an anode metallization layer).

According to an exemplary embodiment, each GCT cell 91 also includes a gate electrode 7, which is arranged lateral to the thyristor cathode layer 4 and separated from the thyristor cathode layer 4 by the thyristor base layer 6. In an exemplary embodiment, the thyristor buffer layer 8 has a maximum doping concentration of at most $10^{16}$ cm$^{-3}$. As used herein, the term "lateral" for layers shall mean that such layers are arranged lateral to each other in the view of a plane parallel to the first main side 11. According to an exemplary embodiment, the thyristor buffer layer 8 is a continuous buffer layer over the whole area of the wafer in a plane parallel to the first main side 11. The thyristor buffer layer 8 corresponds to the area in which a higher doping concentration than in the low doped drift layer 3, but of the same conductivity type, is present.

A plurality of such GCT cells 91 form the GCT part of the reverse conducting semiconductor device 1 according to an exemplary embodiment of the present disclosure.

The first main sided layers of a GCT cell (e.g., thyristor cathode layer 4, thyristor base layer 6 together with gate electrode 7) may be aligned to the second main sided layers of the GCT cell (e.g., thyristor anode layer 5). In case of non-alignment, that thyristor anode layer 5 which is arranged closest to the first main sided layers shall belong to the same cell. Therefore, in case of non-alignment, the device may be designed in such a way that more than one second sided layer may be allocated to a cell or in which one second sided layer is allocated to two cells.

Each diode cell 96 includes a diode anode electrode 28 (e.g., exemplarily in form of an anode metallization layer), a p doped diode anode layer 55 on the first main side 11, which is separated from the thyristor base layer 6 by the diode drift layer 3, the drift layer 3, an (n+) doped diode cathode layer 45 on the second main side 15, which is arranged alternating to the thyristor anode layer 5, and a diode cathode electrode. The diode anode layer 55 contacts the diode anode electrode 28. The thyristor anode electrode 25 of the GCT cells functions as a diode cathode electrode for the diode cells 96. The thyristor anode electrode 25 of the GCT cells extends on the second main side 15 over the whole plane of the wafer in that area, in which GCT and diode cells 91, 96 are arranged. The thyristor anode electrode 25 forms a diode cathode electrode on such parts, at which electrode 25 contacts the diode cathode layer 45.

In each diode cell 96, an n-doped diode buffer layer 32 is arranged between the diode anode layer 55 and the drift layer 3 such that the diode buffer layer 32 covers lateral sides of the diode anode layer 55 from the first main side 11 at least to a depth of 90% of the thickness of the diode anode layer 55. The diode buffer layer has a higher doping concentration than the drift layer. The term lateral sides of the diode anode layer 55 shall be understood as such part of the diode anode layer 55, which extends from the first main side 11 (surface of the wafer 10) to approximately 90% of the thickness (maximum extension of the diode anode layer in a direction perpendicular to the first main side 11). The diode buffer layer 32 may also surround the deeper, centrally arranged part of the diode anode layer 55 such that the diode buffer layer 32 separates the diode anode layer 55 from the drift layer 3. However, in another exemplary embodiment, the diode buffer layer 32 may restricted to the lateral sides, for example, in the central part of the diode anode layer 55, there may be contact of the diode anode layer 55 with the drift layer 3. Of course, the diode buffer layer 32 may also cover the lateral sides of the diode anode layer 55 to more than 90% diode anode layer 55 thickness, but still leaving a contact area to the drift layer 3 open in the central part of the diode anode layer 55. The thickness of the diode anode layer shall be understood as the maximum extension of the diode anode layer 55 in a direction perpendicular to the first main side 11.

The diode anode layer 55 may have a thickness of 3 to 30 μm (e.g., 10 to 20 μm, or 10 to 15 μm). According to an exemplary embodiment, the thyristor base layer 6 has a thickness which is larger than the thickness of the diode anode layer 55, for example, 3 to 10 times larger. In an exemplary embodiment, the thickness of the diode anode layer is between 20 to 120 μm, for example.

According to an exemplary embodiment, the diode anode layer 55 has a maximum carrier concentration in a range of $1*10^{16}$ to $1*10^{18}$ cm$^{-3}$, for example, $5*10^{16}$ to $5*10^{17}$ cm$^{-3}$, whereas the thyristor base layer 6 may have a maximum carrier concentration of at least $5*10^{16}$ cm$^{-3}$, for example, in a range of $1*10^{17}$ to $1*10^{18}$ cm$^{-3}$.

The diode buffer layer 32 corresponds to the area, in which a higher doping concentration than in the low doped drift layer 3, but of the same conductivity type, is present.

In an exemplary embodiment, the thyristor base layer 6 has a maximum carrier concentration higher than a maximum carrier concentration of the diode anode layer 55. Thus, in another embodiment, the thyristor base layer 6 is thicker and higher doped than the diode anode layer 55. In that case, there is less injection efficiency in the diode anode layer 55 and therefore, less lifetime control is needed than for a device with a deeper diode anode layer 55.

In another exemplary embodiment, the diode buffer layer 32 has a sheet carrier concentration of at most $2*10^{12}$ cm$^{-2}$. The sheet carrier concentration of the diode buffer layer shall correspond to the doping concentration of the diode buffer layer integrated over the depth, i.e. a direction perpendicular to the first main side 11. The maximum doping concentration of the diode buffer layer 32 is exemplarily at most $2*10^{16}$ cm$^{-3}$, exemplarily at most $1*10^{15}$ cm$^{-3}$. Depending on the thickness of the diode buffer layer 32, the maximum doping concentration is adapted and vice versa, i.e. a diode buffer layer with higher thickness has a lower maximum doping concentration than a diode buffer layer with lower thickness (but higher maximum doping concentration).

That part of the wafer having a low (n−) doping concentration, which is arranged in a plane between first and second main side 11, 15, forms a drift layer 3. The drift layer 3 includes the thyristor drift layers 3' and the diode drift layers 3", e.g., exemplarily the thyristor and diode drift layers 3', 3" have the same doping concentration. The drift layer 3 is formed as a continuous layer. The drift layer 3 shall be the layer of low doping concentration. According to an exemplary embodiment, the drift layer 3 has a constantly low doping concentration. Herein, the substantially constant doping concentration of the drift layer 3 means that the doping concentration is substantially homogeneous throughout the drift layer 3, however without excluding that fluctuations in the doping concentration within the drift layer being in the order of a factor of one to five may be possibly present due to e.g. a fluctuations in the epitaxial growth process. The final drift layer thickness 32 and doping concentration is chosen due to the application needs. An exemplary doping concentration of the drift layer 3 is between $5*10^{12}$ cm$^{-3}$ and $5*10^{14}$ cm$^{-3}$.

The first main sided layers of a diode cell (e.g., diode anode layer 55) may be aligned to the second main sided layers of the diode cell (e.g., diode cathode layer 45). In case of non-alignment, that diode cathode layer 45 which is arranged closest to the first main sided layers shall belong to the same cell. Therefore, in case of non-alignment, the device may be designed in such a way that more than one second sided layer may be allocated to a cell or in which one second sided layer is allocated to two cells.

According to an exemplary embodiment, the diode cell 96 is separated from the GCT cell 91 by a separation region 35, which is formed by an n-doped layer. According to an exemplary embodiment, in the separation region 35, the drift layer 3 is arranged between the diode and GCT cell 96, 91 and the drift layer 3 extends to the first main side 11. The separation region 35 can also employ standard edge termination techniques for improved field spreading under reverse biasing conditions. In an exemplary embodiment, the separation region 35 has a width of 5 to 200 μm, for example, 20 to 100 μm.

Figure 3:
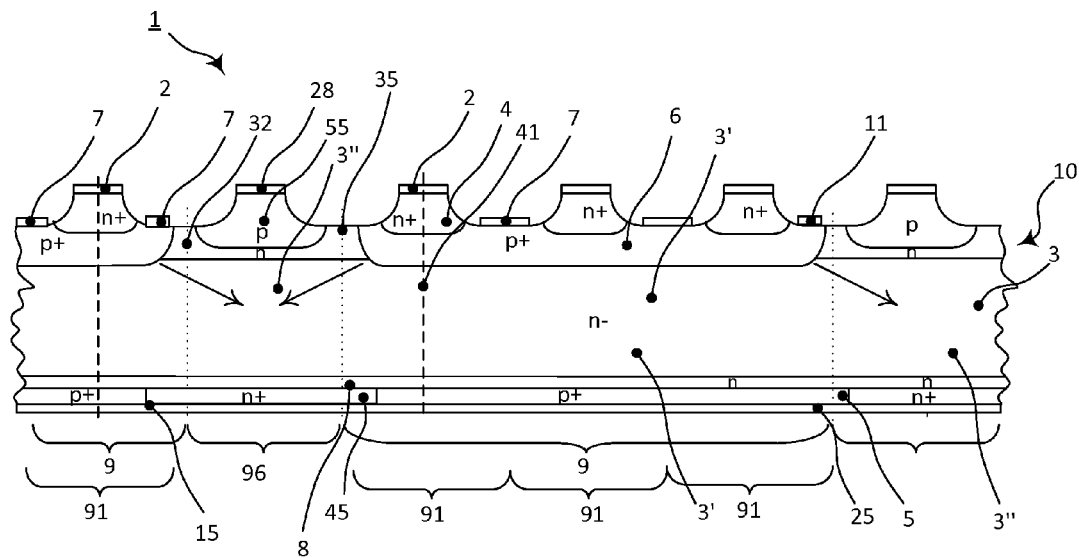
FIGS. 3 and 4 show cross-sectional views of RC-GCTs according to exemplary embodiments of the present disclosure.

In accordance with another exemplary embodiment, the diode buffer layer 32 may extend into the separation region 35; it may even completely cover the drift layer 3 in the separation region 35 towards the first main side 11 as shown in FIG. 3. Thereby, the diode buffer layer 32 separates the diode anode layer 55 from the diode drift layer 3".

A lifetime killing layer may be arranged at least in the diode cells 96. This can be done by limiting the lifetime killing layer to the diode cells 96 by using a mask during creation or by applying a laterally limited ion beam onto the diode cells 96. In another exemplary embodiment, the lifetime killing layer may be formed as a continuous layer over the whole area of the wafer in one plane, the plane being arranged parallel to the main sides. Independently of whether the lifetime killing layer is limited to the diode cells 96 or made as a continuous layer, the device is exemplarily irradiated with protons or Helium ions for the creation of the lifetime killing layer, followed by an anneal step.

As used herein, the term "depth" shall mean the maximum distance to which a layer extends from the side, at which the layer is arranged; for example, for the p thyristor base layer 6, it is the maximum distance from the first main side 11 and in orthogonal projection to the first main side 11. The first main side 11 shall be arranged in that plane, on which the gate electrodes 7 project from the wafer 10.

The device includes at least one mixed part 99, in which diode cells 96 alternate with GCT cells 91. In an exemplary embodiment, the diode cells 96 are arranged such that one diode cell 96 is arranged between two neighbored GCT cells 91. This configuration means that each diode cell is 96 arranged such that one diode anode layer 55 is arranged between two neighbored GCT cells 91, for example, between the thyristor cathode layers 4 belonging to these GCT cells 91 and/or their gate electrodes 7.

In another exemplary embodiment, there may be a plurality of GCT cells 91 arranged directly neighbored to each other such that the ratio of the diode cells 96 to GCT cells 91 varies between 1:1 up to 1:5. The number of diode cells 96 is defined as the number of diode anode layers 55 and for the GCT cells 91 as the number of thyristor cathode layers 4. Also, for the mixed part 99, the diode cell 96 shall be understood as the arrangement of the diode anode layers 55 and the GCT cells 91 as the arrangement of thyristor cathode layers 4.

As used herein, the positioning of a diode cell 96 refers to the positioning of the diode anode layer 55, i.e. the positioning of the first main sided layers of the diode cell 96. As used herein, the positioning of a GCT cell 91 refers to the positioning of the thyristor cathode layer 4 (and gate electrode 7 and thyristor base layer 6), i.e. the positioning of the first main sided layers of the GCT cell 91.

In accordance with an exemplary embodiment, the structures on the first main side 11 are aligned to the structures of the second main side 15. This arrangement means that in a diode cell 96 the diode anode layer 55 is arranged in projection/opposite to the diode cathode layer 45. In the GCT cells 91, the thyristor cathode layer 4 and the gate electrode 7 are arranged in orthogonal projection/opposite to the thyristor anode layer 5. In another exemplary embodiment, the diode cathode layers 45 are arranged in orthogonal projection to a diode anode layer 55 in an area, which is limited at most by an orthogonal projection area of the thyristor cathode layer 4 of the directly adjacent GCT cells. Alternatively, there is no alignment between the first main sided layers and the second main sided layers.

In another exemplary embodiment, there are at least as many GCT cells 96 as there are diode cells 91. The ratio can, for example, be at least 1:3 in order to achieve a good GCT performance. Even with such a ratio, there are still enough diode cells 96 to ensure good performance in diode mode.

The diode cells 96 may have such a small size that during operation of the device in the GCT mode, the plasma is formable in the diode cell 96. This effect may be achieved by at least one of or all of the diode cells 96 have a maximum lateral extension in a plane parallel to the first main side 11 of 50 up to 500 μm. In order to achieve the effect, at least one of or all of the GCT cells 91 may also have a maximum lateral extension in a plane parallel to the first main side 11 of 50 up to 500 μm. In another exemplary embodiment, at least one or all of the GCT and the diode cells have a maximum lateral extension in a plane parallel to the first main side 11 of 50 up to 500 μm. Lateral extension of a cell can be understood as the distance between two neighbored cells, e.g., the distance between a diode anode layer 55 and one of the first main sided layers of a directly neighbored GCT cell or between the first main sided layers of two directly neighbored GCT cells.

The thyristor cathode layer 4 includes one first half part, which is arranged closer to a diode cathode layer 45 than a second half part. The area in which the diode cathode layer 45 is arranged may be further limited by the diode cell area and the orthogonal projection area of the first half part of the first cathode layers 4 of the directly adjacent GCT cells 91. This arrangement means that the diode cathode layers 45 are arranged in orthogonal projection to an area of a diode anode layer 55 which is limited at most by an orthogonal projection area of that half part of the thyristor cathode layer 4 of the directly adjacent GCT cells 91, which is arranged towards the diode cathode layer 45.

The total area of the diode cathode layers 45 in a plane parallel to the first main side 11 can be, for example, chosen to be 10 to 30% of the total wafer area.

Figure 4:
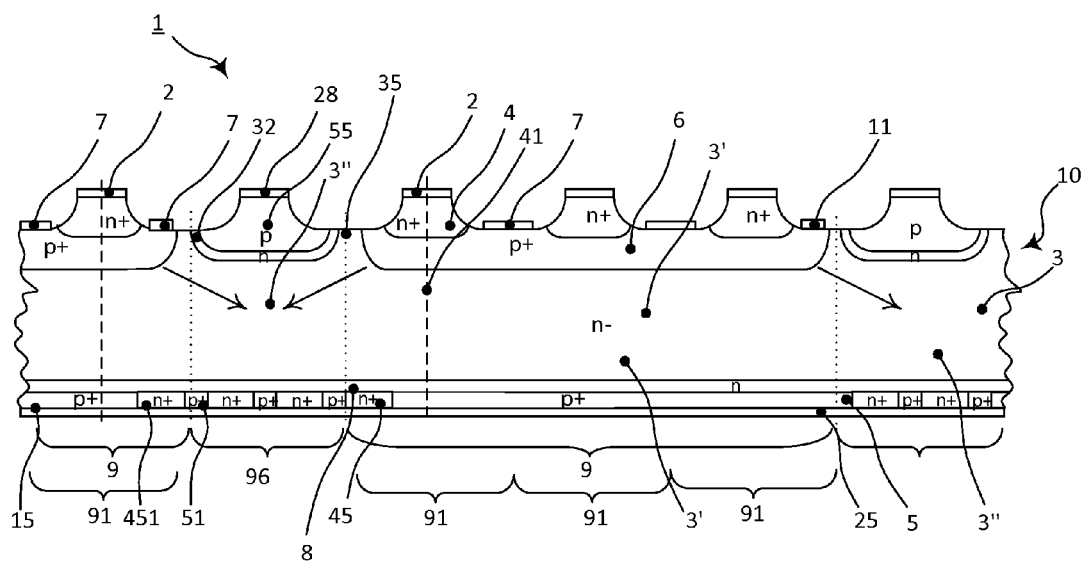

As shown in FIG. 4, the diode cathode layer 45 may be formed of distributed cathode regions 451 alternating with p+ doped anode short regions 51 of the second conductivity type. The anode short regions 51 do not have to be aligned with the structure of the device on the first main side 11. According to an exemplary embodiment, the diode cathode layers 45 as well as the thyristor anode layers 5 and the anode short regions 51 do not have to be positioned in orthogonal projection to the diode anode layer 55 or the thyristor cathode layer 4, respectively.

To allow fast switching between GCTs to the diode mode, the diode cells 96 (e.g., diode anode layers 55) may be distributed uniformly over the wafer area in the mixed part 99.

Figure 6:
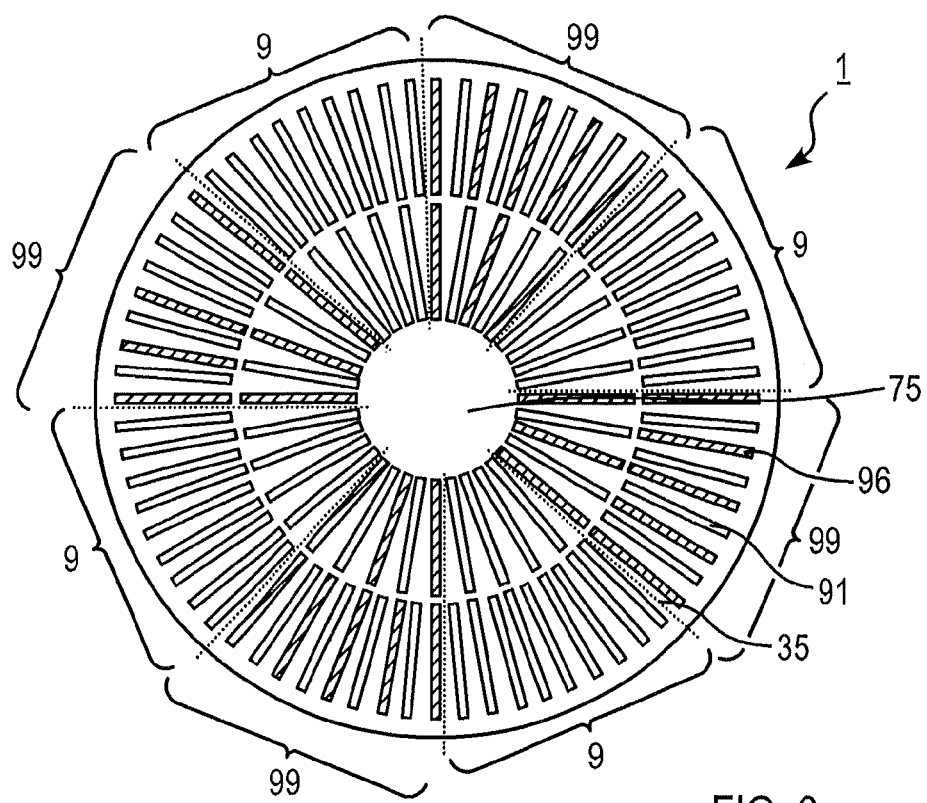
FIG. 6 shows a top view of an RC-GCT according to an exemplary embodiment of the present disclosure.

As shown in FIG. 6, it may also be advantageous to have a pilot GCT part 9 on the wafer 10, which includes only GCT cells 91 (for example, six or more, such as at least 10), which are arranged directly adjacent to each other, and not having a diode cell in the pilot GCT part 9. This arrangement means that a plurality of first cathode layers 4, thyristor base layers 6 and gate electrodes 7 are arranged directly adjacent to each other without having a diode anode layer 4 in between. Such a pilot GCT part 9 is provided on the first main side 11 of thyristor cathode layers 4 and gate electrodes 7 (together with the common, continuous thyristor base layer 6), which are arranged directly adjacent to each other without having a diode anode layer 4 in between.

Such a pilot GCT part 9 can be a single pilot GCT part or there may be a plurality, i.e. two or more such GCT parts arranged in the device. The total area of the GCT pilot parts 9 can be 10 to 50% of the total wafer area. With such a pilot GCT part 9 the turn-on performance of the device can be improved.

Figure 5:
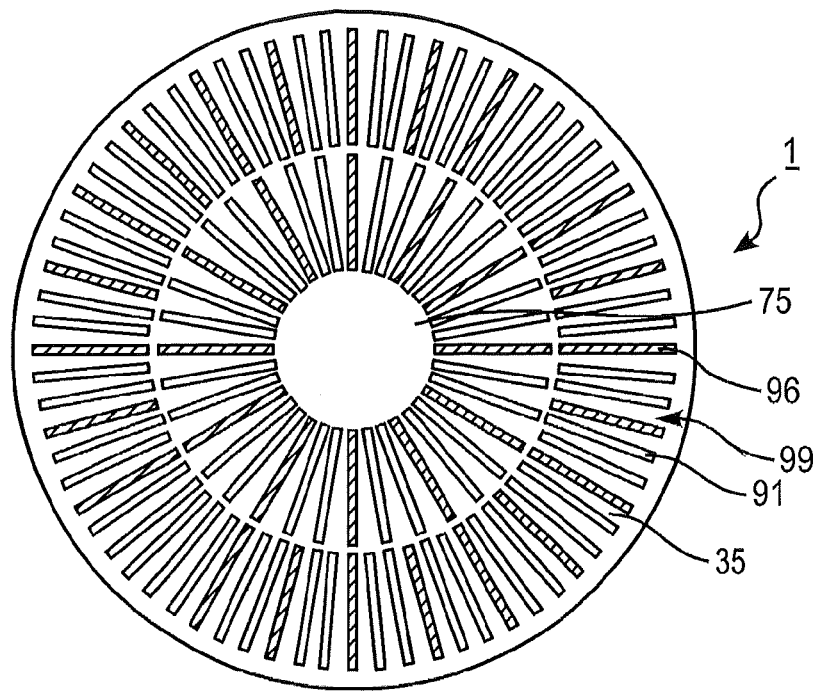
FIG. 5 shows a top view of an RC-GCT according to an exemplary embodiment of the present disclosure.

In yet another embodiment, the wafer 10 has a shape of a circle and the first cathode layers 4 and the diode anode layers 55 are arranged as stripes radially to a center of the circle. The diode cells 96 may be arranged in a regular manner around the center of the circle as shown in FIG. 5. In another alternative, there are pilot GCT parts 9, arranged in segments of the circle alternating with segments, in which GCT cells 95 alternate with diode cells 91, thus forming an area 99 mixed with GCT cells 91 and diode cells 96.

In accordance with another exemplary embodiment, the above-described conductivity types are switched, i.e. all layers of the first conductivity type are p-type (e.g., the drift layer 3) and all layers of the second conductivity type are n-type (e.g., thyristor base layer 6).

It should be noted that the term "comprising" does not exclude other elements or steps, and that the indefinite article "a" or "an" does not exclude the plural. Also, it is conceived that elements described in association with different embodiments may be combined.

The exemplary embodiments described above shall not limit the scope of the present disclosure. The above-mentioned designs and arrangements are just examples for any kind of possible designs and arrangements for the thyristor base layer(s) and well (zones).

It will be appreciated by those skilled in the art that the present disclosure can be embodied in other specific forms without departing from the spirit or essential characteristics thereof. The presently disclosed embodiments are therefore considered in all respects to be illustrative and not restricted. The scope of the disclosure is indicated by the appended claims rather than the foregoing description and all changes that come within the meaning and range and equivalence thereof are intended to be embraced therein.

REFERENCE LIST

1 Reverse conducting power semiconductor device
1' Known reverse conducting power semiconductor device
10 Wafer
11 First main side
15 Second main side
2 Thyristor cathode electrode
25 Thyristor anode electrode
28 Second anode electrode
3, 3', 3" Drift layer
32 Diode buffer layer
35 Separation region
4 Thyristor cathode layer
41 Half part
45 Diode cathode layer
451 Distributed cathode region
5 Thyristor anode layer
51 Anode short region
55 Diode anode layer
6 Thyristor base layer
7 Gate electrode
75 Gate contact
8 Buffer layer
9 Pilot GCT part
91 GCT cell
96 Diode cell
97 Single diode
99 Mixed GCT/diode part

What is claimed is:
1. A reverse-conducting power semiconductor device with a wafer having a first main side and a second main side, the second main side being arranged parallel to the first main side, the device comprising:
   a plurality of diode cells; and
   a plurality of gate commutated thyristor (GCT) cells,
   wherein each GCT cell comprises layers in the following order between the first and second main sides:
      (i) a thyristor cathode electrode;
      (ii) a thyristor cathode layer of a first conductivity type;
      (iii) a thyristor base layer of a second conductivity type different from the first conductivity type;
      (iv) a drift layer of the first conductivity type;
      (v) a thyristor buffer layer of the first conductivity type;
      (vi) a thyristor anode layer of the second conductivity type; and
      (vii) a thyristor anode electrode,
   wherein each GCT cell further comprises a gate electrode which is arranged lateral to the thyristor cathode layer and separated from the thyristor cathode layer by the thyristor base layer, wherein each diode cell comprises (i) a diode anode electrode on the first main side, (ii) a diode anode layer of the second conductivity type which is separated from the thyristor base layer by the drift layer, (iii) the drift layer, (iv) a diode cathode layer of the first conductivity type which is arranged alternating to the thyristor anode layer on the second main side, and (v) a diode cathode electrode, wherein the device comprises at least one mixed part in which the diode anode layers of the diode cells alternate with the first cathode layers of the GCT cells, and wherein, in at least one of the diode cells, a diode buffer layer of the first conductivity type is arranged between the diode anode layer and the drift layer such that the diode buffer layer covers lateral sides of the diode anode layer from the first main side at least to a depth of 90% of the thickness of the diode anode layer.

2. The device according to claim 1, wherein the diode buffer layer completely covers the diode anode layer.

3. The device according to claim 1, wherein the diode anode layer has a thickness of 3 to 30 μm.

4. The device according to claim 1, wherein the thyristor base layer has a thickness which is larger than the thickness of the diode anode layer.

5. The device according to claim 2, wherein the thyristor base layer has a thickness which is larger than the thickness of the diode anode layer.

6. The device according to claim 4, wherein the thickness of the thyristor base layer is 3 to 10 times larger than the thickness of the diode anode layer.

7. The device according to claim 1, wherein the thyristor base layer has a thickness in a range between 20 to 120 μm.

8. The device according to claim 1, wherein the diode buffer layer has a sheet carrier concentration of at most $2*10^{12}$ cm$^{-2}$.

9. The device according to claim 2, wherein the diode buffer layer has a sheet carrier concentration of at most $2*10^{12}$ cm$^{-2}$.

10. The device according to claim 1, wherein the diode buffer layer has a maximum carrier concentration of at most one of $2*10^{16}$ cm$^{-3}$ and $1*10^{15}$ cm$^{-3}$.

11. The device according to claim 1, wherein the diode anode layer has a maximum carrier concentration in a range of one of (i) $1*10^{16}$ to $1*10^{18}$ cm$^{-3}$ and (ii) $5*10^{16}$ to $5*10^{17}$ cm$^{-3}$.

12. The device according to claim 1, wherein the thyristor base layer has a maximum carrier concentration higher than a maximum carrier concentration of the diode anode layer.

13. The device according to claim 2, wherein the thyristor base layer has a maximum carrier concentration higher than a maximum carrier concentration of the diode anode layer.

14. The device according to claim 1, wherein the thyristor base layer has a maximum carrier concentration of one of (i) at least $5*10^{16}$ cm$^{-3}$ and (ii) in a range of $1*10^{17}$ to $1*10^{18}$ cm$^{-3}$.

15. The device according to claim 1, comprising:
at least one pilot GCT part which includes a plurality of first cathode layers and gate electrodes, which are arranged directly adjacent to each other without having a diode anode layer in between.

16. The device according to claim 1, wherein the diode anode layers are distributed uniformly over the wafer area in the mixed part.

17. The device according to claim 1, wherein at least one of the first main sided part of the diode cells to the first main sided part of the GCT cells or between two neighbored first main sided parts of the GCT cells have a maximum lateral distance to each other in a plane parallel to the first main side of 50 up to 500 μm.

18. The device according to claim 1, wherein the diode cathode layers are arranged in orthogonal projection to a diode anode layer in an area which is limited at most by an orthogonal projection area of the thyristor cathode layer of the directly adjacent GCT cells.

19. The device according to claim 3, wherein the diode anode layer has a thickness of 10 to 20 μm.

20. The device according to claim 3, wherein the diode anode layer has a thickness of 10 to 15 μm.

21. The device according to claim 2, wherein the diode anode layer has a thickness of 3 to 30 μm.

22. The device according to claim 21, wherein the diode anode layer has a thickness of 10 to 20 μm.

23. The device according to claim 21, wherein the diode anode layer has a thickness of 10 to 15 μm.

24. The device according to claim 5, wherein the thickness of the thyristor base layer has a thickness which is 3 to 10 times larger than the thickness of the diode anode layer.

25. The device according to claim 2, wherein the diode anode layer has a maximum carrier concentration in a range of one of (i) $1*10^{16}$ to $1*10^{18}$ cm$^{-3}$ and (ii) $5*10^{16}$ to $5*10^{17}$ cm$^{-3}$.

26. The device according to claim 12, wherein the thyristor base layer has a maximum carrier concentration of one of (i) at least $5*10^{16}$ cm$^{-3}$ and (ii) in a range of $1*10^{17}$ to $1*10^{18}$ cm$^{-3}$.

27. The device according to claim 13, wherein the thyristor base layer has a maximum carrier concentration of one of (i) at least $5*10^{16}$ cm$^{-3}$ and (ii) in a range of $1*10^{17}$ to $1*10^{18}$ cm$^{-3}$.

28. The device according to claim 2, comprising:
at least one pilot GCT part which includes a plurality of first cathode layers and gate electrodes, which are arranged directly adjacent to each other without having a diode anode layer in between.

29. The device according to claim 2, wherein the diode anode layers are distributed uniformly over the wafer area in the mixed part.

30. The device according to claim 2, wherein at least one of the first main sided part of the diode cells to the first main sided part of the GCT cells or between two neighbored first main sided parts of the GCT cells have a maximum lateral distance to each other in a plane parallel to the first main side of 50 up to 500 μm.

31. The device according to claim 2, wherein the diode cathode layers are arranged in orthogonal projection to a diode anode layer in an area which is limited at most by an orthogonal projection area of the thyristor cathode layer of the directly adjacent GCT cells.

* * * * *